(12) United States Patent
Rathert et al.

(10) Patent No.: US 11,656,274 B2
(45) Date of Patent: May 23, 2023

(54) SYSTEMS AND METHODS FOR EVALUATING THE RELIABILITY OF SEMICONDUCTOR DIE PACKAGES

(71) Applicant: KLA Corporation, Milpitas, CA (US)

(72) Inventors: Robert J. Rathert, Mechanicsville, VA (US); David W. Price, Austin, TX (US); Chet V. Lenox, Lexington, TX (US); Oreste Donzella, San Ramon, CA (US)

(73) Assignee: KLA Corporation, Milpitas, CA (US)

( * ) Notice: Subject to any disclaimer, the term of this patent is extended or adjusted under 35 U.S.C. 154(b) by 104 days.

(21) Appl. No.: 17/212,877

(22) Filed: Mar. 25, 2021

(65) Prior Publication Data

US 2022/0260632 A1    Aug. 18, 2022

Related U.S. Application Data

(60) Provisional application No. 63/149,367, filed on Feb. 15, 2021.

(51) Int. Cl.
*G01R 31/28* (2006.01)
*H01L 21/66* (2006.01)

(52) U.S. Cl.
CPC ..... *G01R 31/2894* (2013.01); *G01R 31/2856* (2013.01); *H01L 22/34* (2013.01)

(58) Field of Classification Search
CPC .. G01R 31/2894; G01R 31/2856; H01L 22/34
(Continued)

(56) References Cited

U.S. PATENT DOCUMENTS 10,761,128 B2    9/2020  Price et al.
11,293,970 B2    4/2022  Price et al.
(Continued)

FOREIGN PATENT DOCUMENTS

EP        3407217 A1 * 11/2018  ......... G06F 16/2465
KR    20190040175 A     4/2019
(Continued)

OTHER PUBLICATIONS

International Search Report and Written Opinion in International Application No. PCT/US2022/015561 dated May 30, 2022, 6 pages.
(Continued)

*Primary Examiner* — Jermele M Hollington
*Assistant Examiner* — Courtney G McDonnough
(74) *Attorney, Agent, or Firm* — Suiter Swantz pc llo

(57) ABSTRACT

A system and method for evaluating the reliability of semiconductor die packages are configured to sort a plurality of semiconductor dies with a Known Good Die (KGD) subsystem based on a comparison of an inline part average testing (I-PAT) score of each of the plurality of semiconductor dies to a plurality of I-PAT score thresholds, where the semiconductor die data includes the I-PAT score for each of the plurality of semiconductor dies, where the I-PAT score represents a weighted defectivity of the corresponding semiconductor die. The semiconductor dies may be filtered to remove at-risk semiconductor dies prior to sorting. The semiconductor die data may be received from a plurality of semiconductor die supplier subsystems. The KGD subsystem may transmit semiconductor die reliability data about the sorted plurality of semiconductor dies to a plurality of semiconductor die packager subsystems.

35 Claims, 8 Drawing Sheets

(58) Field of Classification Search
USPC .................................................. 324/757.04
See application file for complete search history.

(56) References Cited

U.S. PATENT DOCUMENTS

| | | |
|---|---|---|
| 2015/0364218 A1 | 12/2015 | Frayer et al. |
| 2016/0148850 A1 | 5/2016 | David |
| 2019/0295908 A1* | 9/2019 | Rathert .................. H01L 22/20 |
| 2021/0193613 A1* | 6/2021 | Hua .................. H01L 21/02389 |
| 2021/0239757 A1 | 8/2021 | Price et al. |

FOREIGN PATENT DOCUMENTS

| | | | |
|---|---|---|---|
| WO | WO-2017171863 A1 * | 10/2017 | ....... H01L 21/02381 |
| WO | 2018175214 A1 | 9/2018 | |

OTHER PUBLICATIONS

Chung, Key C. et al., "Back-End Based Chiplet Integration Solutions & Roadmap", 2020 VLSI Technology Symposium, 52 pages.

* cited by examiner

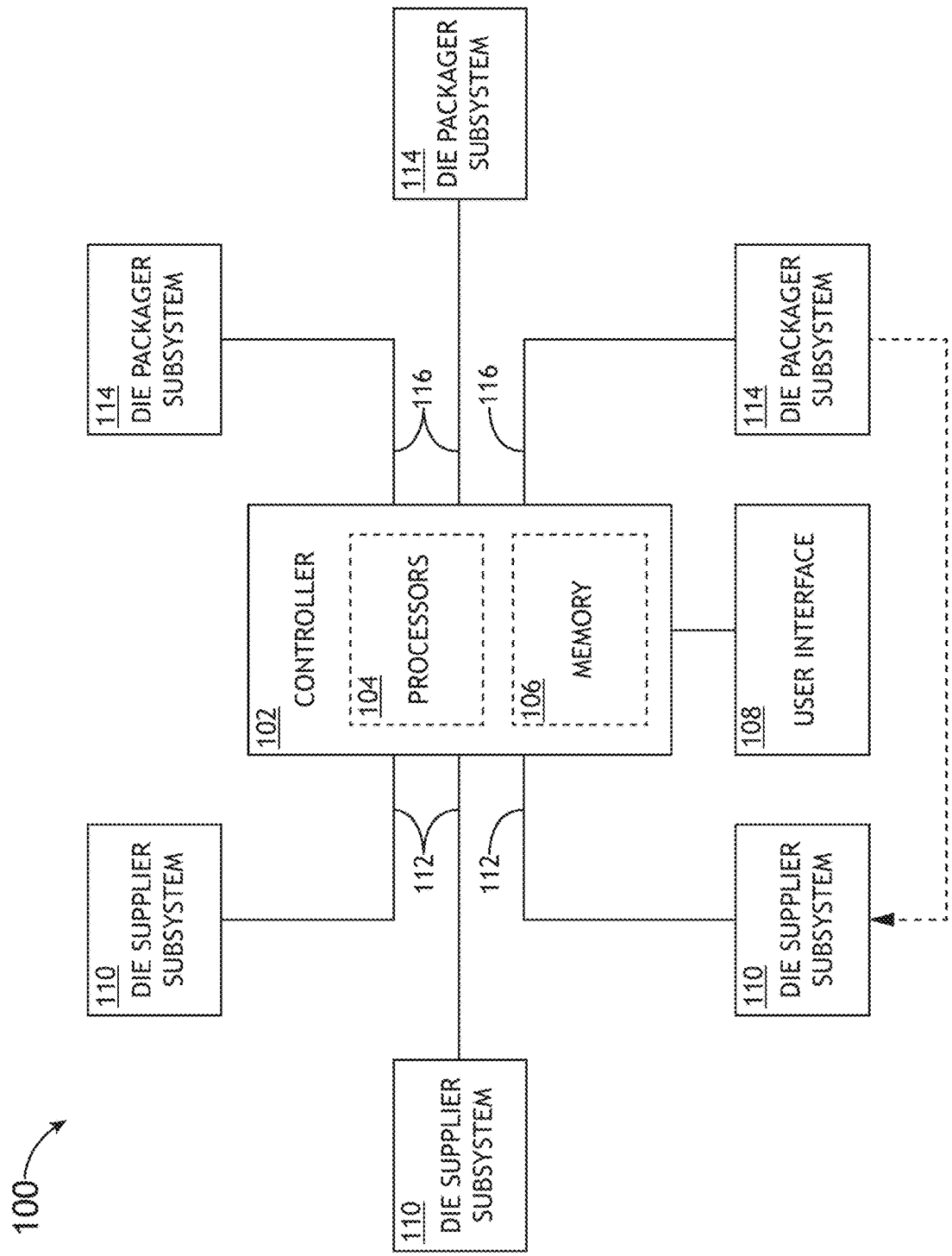

SYSTEMS AND METHODS FOR EVALUATING THE RELIABILITY OF SEMICONDUCTOR DIE PACKAGES

CROSS-REFERENCE TO RELATED APPLICATION

The present application claims the benefit of U.S. Provisional Application Ser. No. 63/149,367 filed on Feb. 15, 2021, which is incorporated herein by reference in the entirety.

TECHNICAL FIELD

The present disclosure relates generally to semiconductor devices and, more particularly, to systems and methods for evaluating the reliability of semiconductor die packages.

BACKGROUND

Fabrication of semiconductor devices may typically require hundreds or thousands of processing steps to form a functioning device. Over the course of these processing steps, various inspection and/or metrology measurements may be performed to identify defects and/or monitor various parameters on the devices, and electrical testing may be performed instead of or in addition to the various inspection and/or metrology measurements to verify or assess the functionality of the device. However, while some detected defects and metrology errors may be so significant as to clearly indicate a device failure, lesser variations may cause early reliability failures of the device after exposure to their working environment. Risk-averse users of semiconductor devices (e.g., such as automotive, military, aeronautical and medical applications) are now looking for failure rates in the parts-per-billion (PPB) range, exceeding current parts-per-million (PPM) levels. Evaluating the reliability of semiconductor die packages from which semiconductor dies are fabricated is key to meeting these industry requirements as the need for semiconductor devices in automotive, military, aeronautical, and medical applications continues to increase. Therefore, it may be desirable to provide systems and methods for evaluating the reliability of semiconductor die packages.

SUMMARY

A system is disclosed, in accordance with one or more embodiments of the present disclosure. In one illustrative embodiment, the system includes a controller communicatively coupled to a plurality of semiconductor die supplier subsystems and a plurality of semiconductor die packager subsystems. In another illustrative embodiment, the controller includes one or more processors and memory. In another illustrative embodiment, the memory is configured to store a set of program instructions. In another illustrative embodiment, the one or more processors are configured to execute program instructions causing the one or more processors to receive semiconductor die data about a plurality of semiconductor dies from the plurality of semiconductor die supplier subsystems. In another illustrative embodiment, the semiconductor die data includes an inline part average testing (I-PAT) score for each of the plurality of semiconductor dies. In another illustrative embodiment, the I-PAT score represents a weighted defectivity of the corresponding semiconductor die. In another illustrative embodiment, the one or more processors are configured to execute program instructions causing the one or more processors to sort the plurality of semiconductor dies with a Known Good Die (KGD) subsystem based on a comparison of the I-PAT score of each of the plurality of semiconductor dies to a plurality of I-PAT score thresholds. In another illustrative embodiment, the one or more processors are configured to execute program instructions causing the one or more processors to transmit semiconductor die reliability data about the sorted plurality of semiconductor dies to the plurality of semiconductor die packager subsystems.

A method is disclosed, in accordance with one or more embodiments of the present disclosure. In one illustrative embodiment, the method may include, but is not limited to, receiving, via a controller, semiconductor die data about a plurality of semiconductor dies from a plurality of semiconductor die supplier subsystems. In another illustrative embodiment, the semiconductor die data includes an inline part average testing (I-PAT) score for each of the plurality of semiconductor dies. In another illustrative embodiment, the I-PAT score represents a weighted defectivity of the corresponding semiconductor die. In another illustrative embodiment, the method may include, but is not limited to, sorting, via the controller, the plurality of semiconductor dies with a Known Good Die (KGD) subsystem based on a comparison of the I-PAT score of each of the plurality of semiconductor dies to a plurality of I-PAT score thresholds. In another illustrative embodiment, the method may include, but is not limited to, transmitting, via the controller, semiconductor die reliability data about the sorted plurality of semiconductor dies to a plurality of semiconductor die packager subsystems.

A system is disclosed, in accordance with one or more embodiments of the present disclosure. In one illustrative embodiment, the system includes a plurality of semiconductor die supplier subsystems. In another illustrative embodiment, the system includes a plurality of semiconductor die packager subsystems. In another illustrative embodiment, the system includes a controller communicatively coupled to the plurality of semiconductor die supplier subsystems and the plurality of semiconductor die packager subsystems. In another illustrative embodiment, the controller includes one or more processors and memory. In another illustrative embodiment, the memory is configured to store a set of program instructions. In another illustrative embodiment, the one or more processors are configured to execute program instructions causing the one or more processors to receive semiconductor die data about a plurality of semiconductor dies from the plurality of semiconductor die supplier subsystems. In another illustrative embodiment, the semiconductor die data includes an inline part average testing (I-PAT) score for each of the plurality of semiconductor dies. In another illustrative embodiment, the I-PAT score represents a weighted defectivity of the corresponding semiconductor die. In another illustrative embodiment, the one or more processors are configured to execute program instructions causing the one or more processors to sort the plurality of semiconductor dies with a Known Good Die (KGD) subsystem based on a comparison of the I-PAT score of each of the plurality of semiconductor dies to a plurality of I-PAT score thresholds. In another illustrative embodiment, the one or more processors are configured to execute program instructions causing the one or more processors to transmit semiconductor die reliability data about the sorted plurality of semiconductor dies to the plurality of semiconductor die packager subsystems.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 1A is a block diagram view of a system for evaluating the reliability of semiconductor die packages, in accordance with one or more embodiments of the present disclosure;

DETAILED DESCRIPTION

Figure 1B:
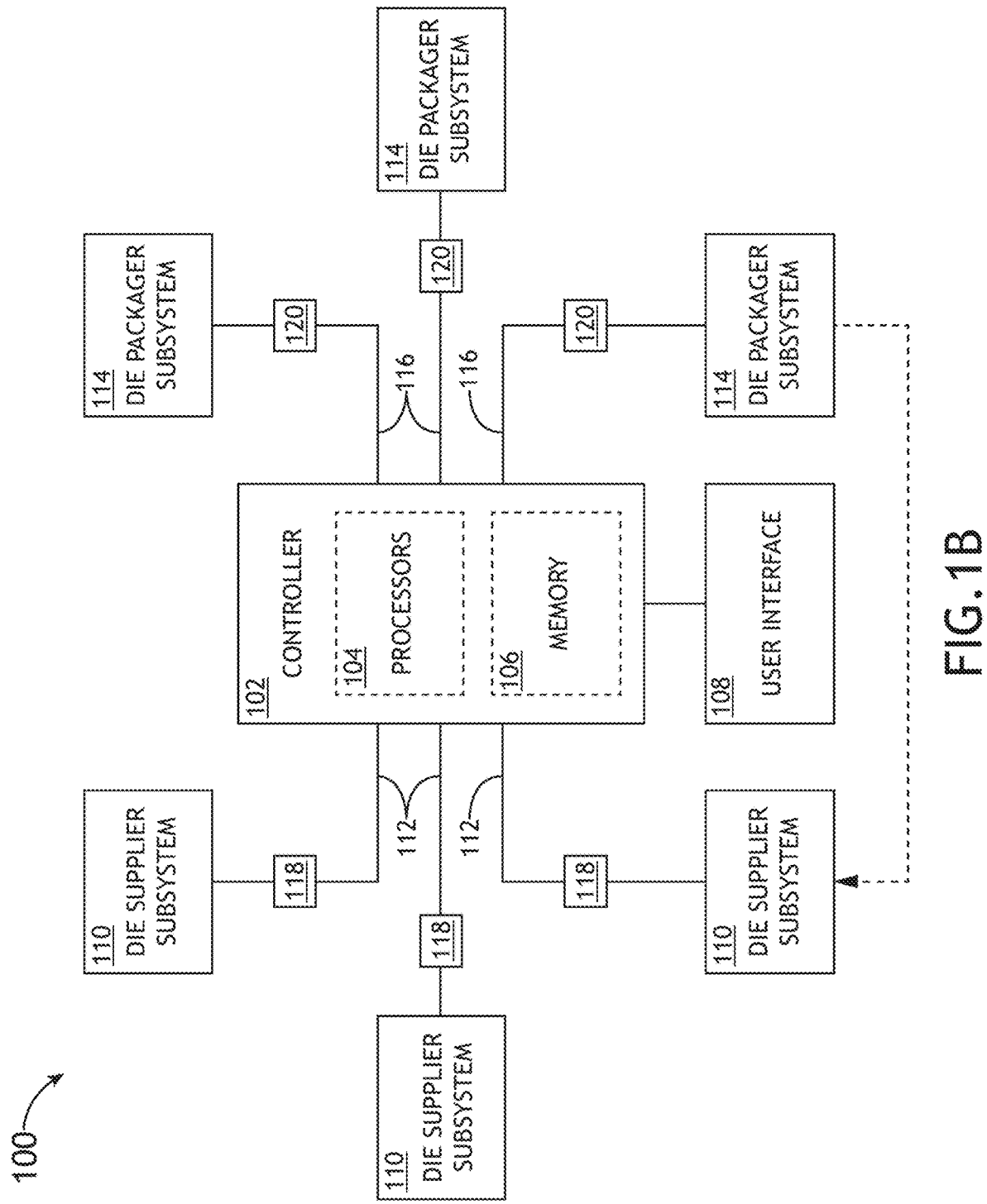
FIG. 1B is a block diagram view of a system for evaluating the reliability of semiconductor die packages, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Fabrication of semiconductor devices may typically require hundreds or thousands of processing steps to form a functioning device. Over the course of these processing steps, various inspection and/or metrology measurements may be performed to identify defects and/or monitor various parameters on the devices, and electrical testing may be performed instead of or in addition to the various inspection and/or metrology measurements to verify or assess the functionality of the device. For example, semiconductor die manufacturers may employ electrical tests and baseline pareto methods to identify defects and/or monitor various parameters on the devices. For example, the electrical tests and baseline pareto methods may be employed to find "killer" defects which may result in immediate device failure.

However, while some detected defects and metrology errors may be so significant as to clearly indicate a device failure, lesser variations may cause early reliability failures of the device after exposure to their working environment. For example, semiconductor die manufacturers may also employ part average testing (PAT) methods including, but not limited to, inline part average testing (I-PAT) to locate latent reliability defects (LRD) (or reliability defects or latent defects, for purposes of the present disclosure). For instance, LRD may be minor defects that may not lead to failure during manufacturing/testing or may not lead to immediate device failure during operation (e.g., in contrast to killer defects), but may lead to early-life failure of the device during operation when used in a working environment. An example of determining LRD during semiconductor device fabrication may be found is U.S. patent application Ser. No. 17/151,583, filed Jan. 18, 2021, which is incorporated herein in the entirety. Example uses of PAT methods including, but not limited to, I-PAT methods during semiconductor device fabrication may be found in U.S. Pat. No. 10,761,128, issued on Sep. 1, 2020, and U.S. patent application Ser. No. 17/101,856, filed on Nov. 23, 2020, which are each incorporated herein in the entirety.

Risk-averse users of semiconductor devices (e.g., such as automotive, military, aeronautical, and medical applications) are now looking for failure rates in the parts-per-billion (PPB) range, exceeding current parts-per-million (PPM) levels. Evaluating the reliability of semiconductor die packages from which the semiconductor dies are fabricated is key to meeting these industry requirements as the need for semiconductor devices in automotive, military, aeronautical, and medical applications continues to increase.

As Moore's Law scaling slows, semiconductor chip designers may look for additional or alternative ways to boost device performance in various stages of semiconductor die package fabrication, while continuing to meet or exceed desired failure rates. One such stage includes back-end-of-line (BEOL) packaging, where a variety of 2.5D (or 2.5-dimensional) and/or 3D (or three-dimensional) die stacking techniques may be employed. For example, the techniques may be employed to reduce overall package size, lower power consumption and improve bandwidth of a system including the semiconductor die packages, or the like.

Semiconductor die packages may range in complexity from memory packages or an image sensor stacked on logic, to heterogeneous integration of function-specific chiplet components from multiple suppliers (e.g., manufacturers, vendors, or the like) into a high-performance computer system. As complexity increases, semiconductor die count in the semiconductor die package almost always rapidly increases as well. The aggregate cost of all semiconductor dies in the semiconductor die package, in addition to the (often expensive) interconnect costs, generates a high-cost semiconductor die package.

Testing the semiconductor die package may require integrating all semiconductor dies before the semiconductor die package may be tested for full functionality. However, a semiconductor die package often is failed if even a single die or chiplet in the semiconductor die package fails, as reworking is generally not possible due to the integrated nature of the semiconductor dies. In addition, testing the semiconductor dies is increasingly difficult due to the employing of "bare" dies, or dies that do not have a molded package or leads. Without the molded package or leads, the bare dies may be difficult to probe or test, which may limit the evaluation of each die during various electrical tests either before or after the semiconductor dies are integrated into the semiconductor die package.

Previous methods for choosing semiconductor dies to integrate into the semiconductor die package involved relying on known mature device designs and electrical test results to increase a probability the semiconductor dies integrated into the package would be a good semiconductor die. Electrical testing alone, however, allows for a predictable quantity of failing dies escaping (e.g., thus falsely passing inspection) based on semiconductor die yield and test coverage. The cumulative effect of the escape will increase as the number of semiconductor dies in a semiconductor die package increases, thus degrading the yield of the completed semiconductor die packages. In addition, electrical testing is not readily applicable to techniques employing bare semiconductor dies due to a lack of package leads, resulting in a poor screening of the semiconductor dies for low-reliability instances. Further, select semiconductor dies (e.g., advanced design rule components semiconductor dies) in a semiconductor die package may have less process maturity, requiring additional screening or electrical testing to ensure reliability that increases cost and fabrication downtime. Further, semiconductor package integrators may not be able to asses a relative reliability score of semiconductor dies in the semiconductor die package with electrical testing, where the semiconductor dies originate from multiple suppliers, such that the integrators may not be able to reject high-risk semiconductor dies and/or to create semiconductor die packages of varying target reliability levels and price points.

FIGS. 1A-4C in general illustrate systems and methods for evaluating the reliability of semiconductor die packages, in accordance with one or more embodiments of the present disclosure.

Embodiments of the present disclosure are directed to systems and methods for evaluating the reliability of semiconductor die packages.

In particular, embodiments of the present disclosure are directed to semiconductor die packagers reducing yield loss (and thus reduce costs, fabrication downtime, or the like) by relying on a determination of Known Good Dies (KGD) for use in the semiconductor die package.

In addition, embodiments of the present disclosure are directed to implementing I-PAT methods to generate defectivity scores or rankings (e.g., weighted or unweighted) for one or multiple semiconductor dies across one or multiple semiconductor vendors. For example, the defectivity scores or rankings may be utilized during semiconductor die packaging, in addition to or instead of the scores or rankings being used during semiconductor die fabrication. In addition, the defectivity scores or rankings may be utilized to improve an assessment of KGD or die packages including the KGD. Further, the defectivity scores or rankings may be utilized to filter or reject at-risk semiconductor dies from semiconductor die packages.

Further, embodiments of the present disclosure are directed to pairing semiconductor dies or semiconductor die sub-packages with similar reliability risk profiles. For example, semiconductor dies or semiconductor die sub-packages may be obtained by semiconductor chip packagers, and semiconductor die may be selected and paired with other, similarly-scored or ranked semiconductor dies or semiconductor die sub-packages to ensure a select reliability be met within final semiconductor die packages with a select score or ranking.

Further, embodiments of the present disclosure are directed to segmenting semiconductor die packages into different performance and/or price or value categories. For example, semiconductor die packages may be separated and provided to select industries based on the select score or ranking of the semiconductor die packages.

FIGS. 1A-3 illustrate a system 100 for evaluating the reliability of semiconductor die packages, in accordance with one or more embodiments of the present disclosure.

Referring now to FIGS. 1A and 1B, in one embodiment the system 100 includes a controller or server 102. The controller or server 102 may include one or more processors 104 configured to execute program instructions maintained on or stored in memory 106 (e.g., a memory medium, memory device, or the like).

In this regard, the one or more processors 104 of the controller or server 102 may execute any of the various process steps described throughout the present disclosure. For example, the one or more processors 104 of controller or server 102 may be configured to receive scores for one or more semiconductor dies, rank the one or more semiconductor dies, filter and sort the one or more semiconductor dies, and transmit data about the one or more filtered and sorted semiconductor dies.

In another embodiment, the system 100 includes a user interface 108 coupled (e.g., physically coupled, electrically coupled, communicatively coupled, or the like) to the controller or server 102. For example, the user interface 108 may be a separate device coupled to the controller or server 102. By way of another example, the user interface 108 and the controller or server 102 may be located within a common or shared housing. It is noted herein, however, the controller or server 102 may not include, require, or be coupled to the user interface 108.

In another embodiment, the system 100 includes one or more die supplier subsystems 110 coupled (e.g., physically coupled, electrically coupled, communicatively coupled, or the like) with the controller or server 102. For example, the one or more die supplier subsystems 110 may transmit semiconductor die data 112, which may be received by the controller or server 102.

In another embodiment, the system 100 includes one or more semiconductor die packager subsystems 114. For example, the controller or server 102 may transmit semiconductor die reliability data 116 to the one or more semiconductor die packager subsystems 114.

As illustrated in FIG. 1A, the semiconductor die data 112 may be directly transmitted between the one or more die supplier subsystems 110 and the controller or server 102, and/or the semiconductor die data 112 may be directly transmitted between the controller or server 102 and the one or more semiconductor die packager subsystems 114.

As illustrated in FIG. 1B, the semiconductor die data 112 may be transmitted between the one or more die supplier subsystems 110 and the controller or server 102 via one or more auxiliary controllers or servers 118, and/or the semiconductor die data 112 may be transmitted between the controller or server 102 and the one or more semiconductor die packager subsystems 114 via one or more auxiliary controllers or servers 120. The one or more auxiliary controllers or servers 118, 120 may include, but are not limited to, one or more processors configured to execute program instructions maintained on memory (e.g., a memory medium, memory device, or the like), maintained on a coupled-to user interface, or the like. The semiconductor die data 112 and/or the semiconductor die reliability data 116 may pass through the one or more auxiliary controllers or servers 118, 120 without modification. It is noted herein, however, the one or more auxiliary controllers or servers 118, 120 may be configured to execute program instructions to modify the semiconductor die data 112 and/or the semiconductor die reliability data 116 as it passes through the one or more auxiliary controllers or servers 118, 120, respectively.

The one or more semiconductor die packager subsystems 114 may be configured to transmit information to the one or more semiconductor die supplier subsystems 110. For example, the information may be transmitted directly between the one or more semiconductor die packager subsystems 114 and the one or more semiconductor die supplier subsystems 110. By way of another example, the information may be transmitted via the controller or server 102 (and potentially via the one or more auxiliary controllers or servers 118, 120). In general, the information may be design requests, design iterations as part of a feedback or feed forward loop to address defects, or the like.

Figure 2A:
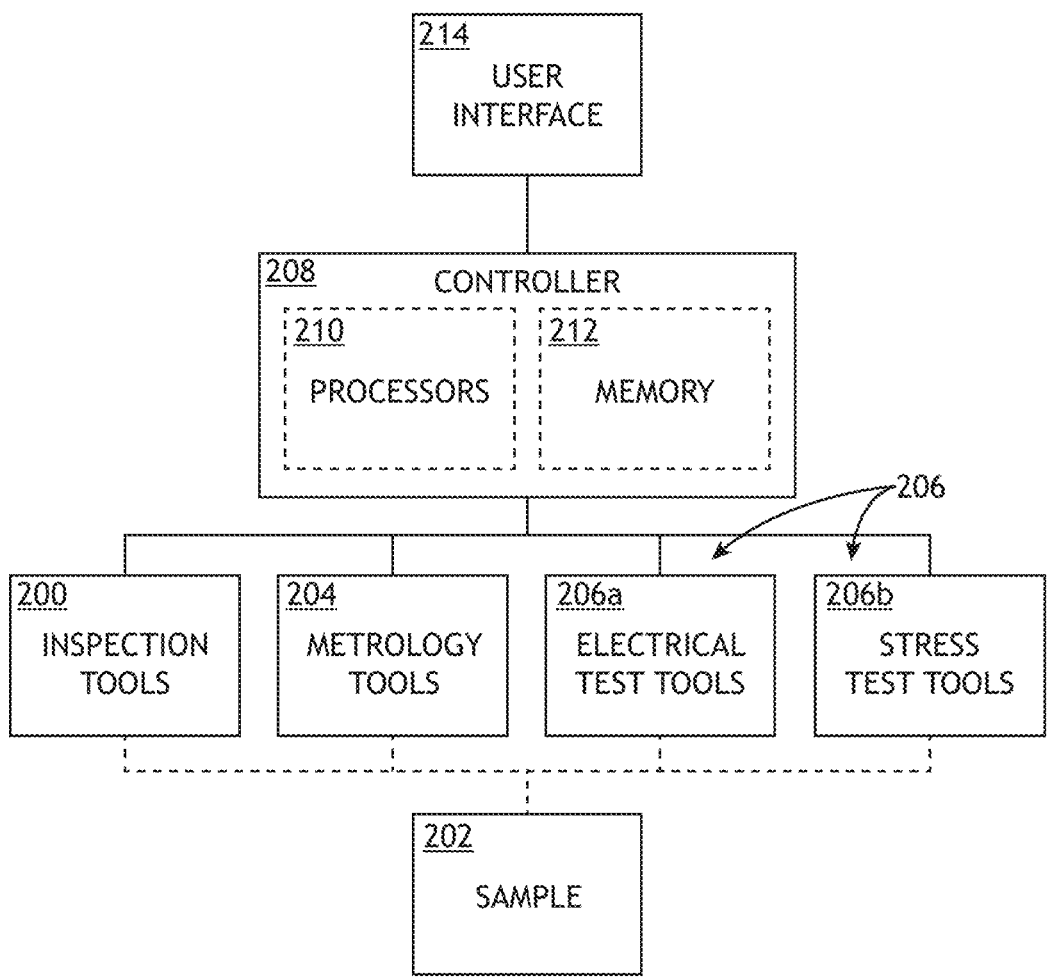
FIG. 2A is a block diagram view of a semiconductor die supplier subsystem or a semiconductor die packager subsystem for evaluating the reliability of semiconductor die packages, in accordance with one or more embodiments of the present disclosure.
Figure 2B:
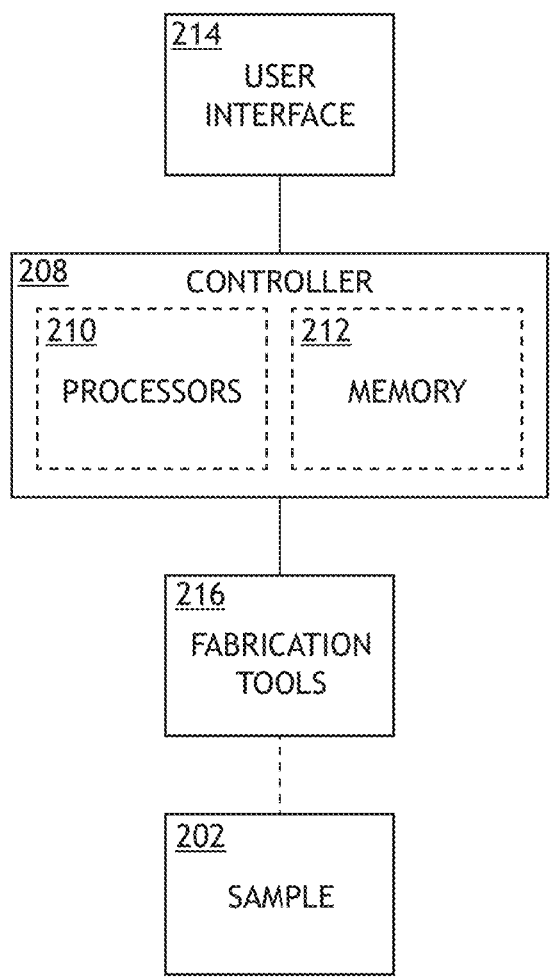
FIG. 2B is a block diagram view of a semiconductor die supplier subsystem or a semiconductor die packager subsystem for evaluating the reliability of semiconductor die packages, in accordance with one or more embodiments of the present disclosure.

FIGS. 2A and 2B illustrate a semiconductor die supplier subsystem 110 and/or a semiconductor die package subsystem 114 of the system 100 for evaluating the reliability of semiconductor die packages, in accordance with one or more embodiments of the present disclosure. It is noted herein the semiconductor die supplier subsystem 110 may be configured to perform processing steps to fabricate and/or analyze semiconductor dies, as described throughout the present disclosure. In addition, it is noted herein the semiconductor die package subsystem 114 may be configured to perform processing steps to fabricate and/or analyze semiconductor die packages, as described throughout the present disclosure.

In one embodiment, the semiconductor die supplier subsystem 110 and/or the semiconductor die package subsystem 114 includes at least one inspection tool 200 (e.g., an in-line sample analysis tool) for detecting defects in one or more layers of a sample 202. The semiconductor die supplier subsystem 110 and/or the semiconductor die package subsystem 114 may generally include any number or type of inspection tools 200. For example, an inspection tool 200 may include an optical inspection tool configured to detect defects based on interrogation of the sample 202 with light from any source such as, but not limited to, a laser source, a lamp source, an X-ray source, or a broadband plasma source. By way of another example, an inspection tool 200 may include a particle-beam inspection tool configured to detect defects based on interrogation of the sample with one or more particle beams such as, but not limited to, an electron beam, an ion beam, or a neutral particle beam. For instance, the inspection tool 200 may include a transmission electron microscope (TEM) or a scanning electron microscope (SEM). For purposes of the present disclosure, it is noted herein the at least one inspection tool 200 may be a single inspection tool 200 or may represent a group of inspection tools 200.

In one non-limiting example, in the case of the semiconductor die supplier subsystem 110, the sample 202 may be a semiconductor wafer of a plurality of semicondcutor wafers, where each semicondcutor wafer of the plurality of semicondcutor wafers includes a plurality of layers, where each layer of the plurality of layers includes a plurality of semiconductor dies, where each semiconductor die of the plurality of semiconductor dies includes a plurality of blocks.

In another non-limiting example, in the case of the semiconductor die package subsystem 114, the sample 202 may be a semiconductor die package formed from a plurality of semiconductor dies arranged in a 2.5D lateral combination of a bare die on a substrate inside an advanced die package or a 3D die package.

For the purposes of the present disclosure, a defect may be considered to be any deviation of a fabricated layer or a fabricated pattern in a layer from design characteristics including, but not limited to, physical, mechanical, chemical, or optical properties. In addition, a defect may be considered to be any deviation in alignment or joining of components in a fabricated semiconductor die package. Further, a defect may have any size relative to a semiconductor die or features thereon. In this way, a defect may be smaller than a semiconductor die (e.g., on the scale of one or more patterned features) or may be larger than a semiconductor die (e.g., as part of a wafer-scale scratch or pattern). For example, a defect may include deviation of a thickness or composition of a sample layer before or after patterning. By way of another example, a defect may include a deviation of a size, shape, orientation, or position of a patterned feature. By way of another example, a defect may include imperfections associated with lithography and/or etching steps such as, but not limited to, bridges between adjacent structures (or lack thereof), pits, or holes. By way of another example, a defect may include a damaged portion of a sample 202 such as, but not limited to, a scratch, or a chip. For instance, a severity of the defect (e.g., the length of a scratch, the depth of a pit, measured magnitude or polarity of the defect, or the like) may be of importance and taken into consideration. By way of another example, a defect may include a foreign particle introduced to the sample 202. By way of another example, a defect may be a misaligned and/or misjoined package component on the sample 202. Accordingly, it is to be understood that examples of defects in the present disclosure are provided solely for illustrative purposes and should not be interpreted as limiting.

In another embodiment, the semiconductor die supplier subsystem 110 and/or the semiconductor die package subsystem 114 includes at least one metrology tool 204 (e.g., an in-line sample analysis tool) for measuring one or more properties of the sample 202 or one or more layers thereof. For example, a metrology tool 204 may characterize properties such as, but not limited to, layer thickness, layer composition, critical dimension (CD), overlay, or lithographic processing parameters (e.g., intensity or dose of illumination during a lithographic step). In this regard, a metrology tool 204 may provide information about the fabrication of the sample 202, one or more layers of the sample 202, or one or more dies of the sample 202 that may be relevant to the probability of manufacturing defects that may lead to reliability issues for the resulting fabricated devices. For purposes of the present disclosure, it is noted herein the at least one metrology tool 204 may be a single metrology tool 204 or may represent a group of metrology tool 204.

In another embodiment, the semiconductor die supplier subsystem 110 and/or the semiconductor die package subsystem 114 includes at least one test tool 206 for testing the functionality of one or more portions of a manufactured device.

For example, the semiconductor die supplier subsystem 110 and/or the semiconductor die package subsystem 114 may include any number or type of electrical test tools 206*a* to complete a preliminary probing at a wafer level. For instance, the preliminary probing may not be designed to try to force a failure at the wafer level.

By way of another example, the semiconductor die supplier subsystem 110 and/or the semiconductor die package subsystem 114 may include any number or type of stress test tool 206b to test, inspect, or otherwise characterize the properties of one or more portions of a fabricated device at any point in the manufacturing cycle. For example, the stress test tool 206b may include, but is not limited to, a pre burn-in electrical wafer sort and final test (e.g., an e-test) or a post burn-in electrical test configured to heat the sample 202 (e.g., an oven or other heat source), cool the sample 202 (e.g., a freezer or other cold source), operate the sample 202 at an incorrect voltage (e.g., a power supply), or the like.

In another embodiment, defects are identified using any combination of in-line sample analysis tools (e.g., inspection tools 200, metrology tools 204, test tools 206 including electrical test tools 206a and/or stress test tools 206b, or the like) after one or more processing steps (e.g., lithography, etching, aligning, joining, or the like) for layers of interest in the semiconductor dies and/or semiconductor die packages. In this regard, the defect detection at various stages of the manufacturing process may be referred to as in-line defect detection.

In another embodiment, the semiconductor die supplier subsystem 110 and/or the semiconductor die package subsystem 114 includes a controller 208. The controller 208 may include one or more processors 210 configured to execute program instructions maintained on memory 212 (e.g., a memory medium, memory device, or the like). Further, the controller 208 may be communicatively coupled with any of the components of the semiconductor die supplier subsystem 110 and/or the semiconductor die package subsystem 114 including, but not limited to, the inspection tools 200, the metrology tools 204, test tools 206 including electrical test tools 206a and/or stress test tools 206b, or the like.

The one or more processors 210 of the controller 208, the one or more processors 104 of the controller or server 102, and/or the one or more processors of the one or more auxiliary controllers or servers 118, 120 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 210 of the controller 208, the one or more processors 104 of the controller or server 102, and/or the one or more processors of the one or more auxiliary controllers or servers 118, 120 may include any device configured to execute algorithms and/or instructions (e.g., program instructions stored in memory). In one embodiment, the one or more processors 210 of the controller 208, the one or more processors 104 of the controller or server 102, and/or the one or more processors of the one or more auxiliary controllers or servers 118, 120 may be embodied as a desktop computer, mainframe computer system, workstation, image computer, parallel processor, networked computer, or any other computer system configured to execute a program configured to operate or operate in conjunction with components of the system 100, as described throughout the present disclosure.

The memory 212 of the controller 208, the memory 106 of the controller or server 102, and/or the memory of the one or more auxiliary controllers or servers 118, 120 may include any storage medium known in the art suitable for storing program instructions executable by the associated respective one or more processors 210 of the controller 208, the one or more processors 104 of the controller or server 102, and/or the one or more processors of the one or more auxiliary controllers or servers 118, 120. For example, the memory 212 of the controller 208, the memory 106 of the controller or server 102, and/or the memory of the one or more auxiliary controllers or servers 118, 120 may include a non-transitory memory medium. By way of another example, the memory 212 of the controller 208, the memory 106 of the controller or server 102, and/or the memory of the one or more auxiliary controllers or servers 118, 120 may include, but is not limited to, a read-only memory (ROM), a random-access memory (RAM), a magnetic or optical memory device (e.g., disk), a magnetic tape, a solid-state drive and the like. It is further noted that the memory 212 of the controller 208, the memory 106 of the controller or server 102, and/or the memory of the one or more auxiliary controllers or servers 118, 120 may be housed in a common controller housing with the one or more processors 210. In one embodiment, the memory 212 of the controller 208, the memory 106 of the controller or server 102, and/or the memory of the one or more auxiliary controllers or servers 118, 120 may be located remotely with respect to the physical location of the respective one or more processors 210 of the controller 208, the one or more processors 104 of the controller or server 102, and/or the one or more processors of the one or more auxiliary controllers or servers 118, 120. For instance, the respective one or more processors 210 of the controller 208, the one or more processors 104 of the controller or server 102, and/or the one or more processors of the one or more auxiliary controllers or servers 118, 120 may access a remote memory (e.g., server), accessible through a network (e.g., internet, intranet, and the like).

In another embodiment, the semiconductor die supplier subsystem 110 and/or the semiconductor die package subsystem 114 includes a user interface 214 coupled (e.g., physically coupled, electrically coupled, communicatively coupled, or the like) to the controller 208. For example, the user interface 214 may be a separate device coupled to the controller 208. By way of another example, the user interface 214 and the controller 208 may be located within a common or shared housing. It is noted herein, however, the controller 208 may not include, require, or be coupled to the user interface 214.

The user interface 214 of the controller 208, the user interface 108 of the controller or server 102, and/or the user interface coupled to the the one or more auxiliary controllers or servers 118, 120 may include, but is not limited to, one or more desktops, laptops, tablets, and the like. The user interface 214 of the controller 208, the user interface 108 of the controller or server 102, and/or the user interface coupled to the the one or more auxiliary controllers or servers 118, 120 may include a display used to display data of the system 100 to a user. The display of the user interface 214 of the controller 208, the user interface 108 of the controller or server 102, and/or the user interface coupled to the the one or more auxiliary controllers or servers 118, 120 may include any display known in the art. For example, the display may include, but is not limited to, a liquid crystal display (LCD), an organic light-emitting diode (OLED) based display, or a CRT display. Those skilled in the art should recognize that any display device capable of integration with a user interface 214 of the controller 208, the user interface 108 of the controller or server 102, and/or the user interface coupled to the the one or more auxiliary controllers or servers 118, 120 is suitable for implementation in the present disclosure. In another embodiment, a user may input selections and/or instructions responsive to data displayed to the user via a user input device of the user interface 214 of the controller 208, the user interface 108 of the controller or server 102, and/or the user interface coupled to the the one or more auxiliary controllers or servers 118, 120.

In one embodiment, the semiconductor die supplier subsystem 110 and/or the semiconductor die package subsystem 114 includes at least one semiconductor manufacturing tool or semiconductor fabrication tool 216. For example, the semiconductor fabrication tool 216 may include any tool known in the art including, but not limited to, an etcher, scanner, stepper, cleaner, or the like. For instance, a fabrication process may include fabricating multiple dies distributed across the surface of a sample (e.g., a semiconductor wafer, or the like), where each die includes multiple patterned layers of material forming a device component. Each patterned layer may be formed by the semiconductor fabrication tool 216 via a series of steps including material deposition, lithography, etching to generate a pattern of interest, and/or one or more exposure steps (e.g., performed by a scanner, a stepper, or the like). By way of another example, the semiconductor fabrication tool 216 may include any tool known in the art configured to package and/or combine semiconductor dies into a 2.5D and/or 3D semiconductor die package. For instance, a fabrication process may include, but is not limited to, aligning semiconductor dies and/or electrical components on the semiconductor dies. In addition, a fabrication process may include, but is not limited to, joining the semiconductor dies and/or the electrical components on the semiconductor dies via hybrid bonding (e.g., die-to-die, die-to-wafer, wafer-to-wafer, or the like) solder, an adhesive, fasteners, or the like. For purposes of the present disclosure, it is noted herein the at least one semiconductor fabrication tool 216 may be a single semiconductor fabrication tool 216 or may represent a group of semiconductor fabrication tools 216.

It is noted herein the terms "fabrication process" and "manufacturing process" may be considered equivalent, along with respective variants of the terms (e.g., "fabrication line" and "manufacturing line", "fabricator" and "manufacturer", or the like), for purposes of the present disclosure.

It is noted herein the embodiments illustrated in FIG. 2A and the embodiments illustrated in FIG. 2B may be considered parts of the same semiconductor die supplier subsystem 110 and/or the semiconductor die package subsystem 114, or different systems 100 or subsystems of the different systems 100, for purposes of the present disclosure. In addition, it is noted herein components within the semiconductor die supplier subsystem 110 and/or the semiconductor die package subsystem 114 illustrated in FIG. 2A and components within the semiconductor die supplier subsystem 110 and/or the semiconductor die package subsystem 114 illustrated in FIG. 2B may be in direct communication or may communicate through the controller 208.

Figure 3:
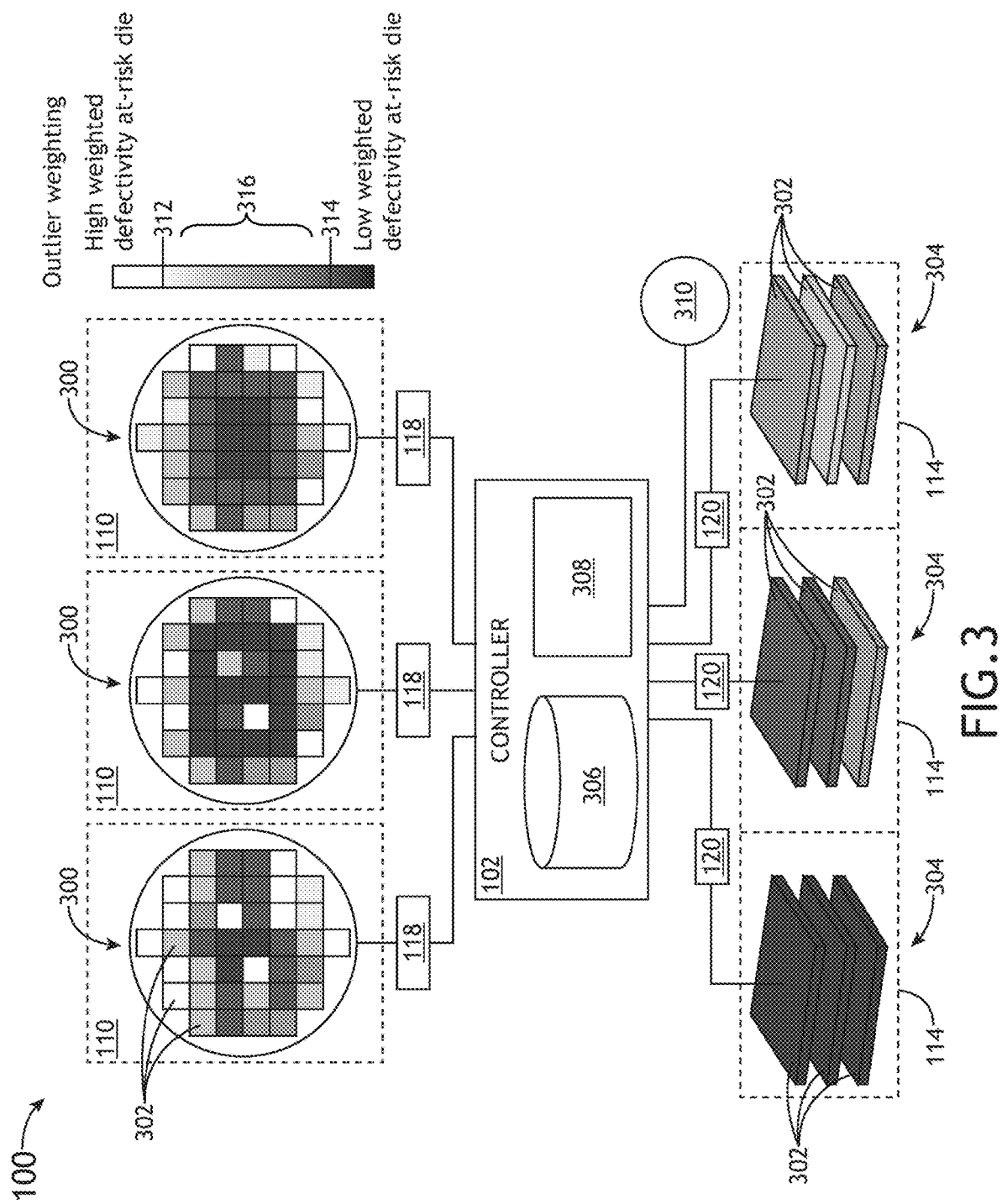
FIG. 3 is a conceptual illustration of a system for evaluating the reliability of semiconductor die packages, in accordance with one or more embodiments of the present disclosure.
Figure 4A:
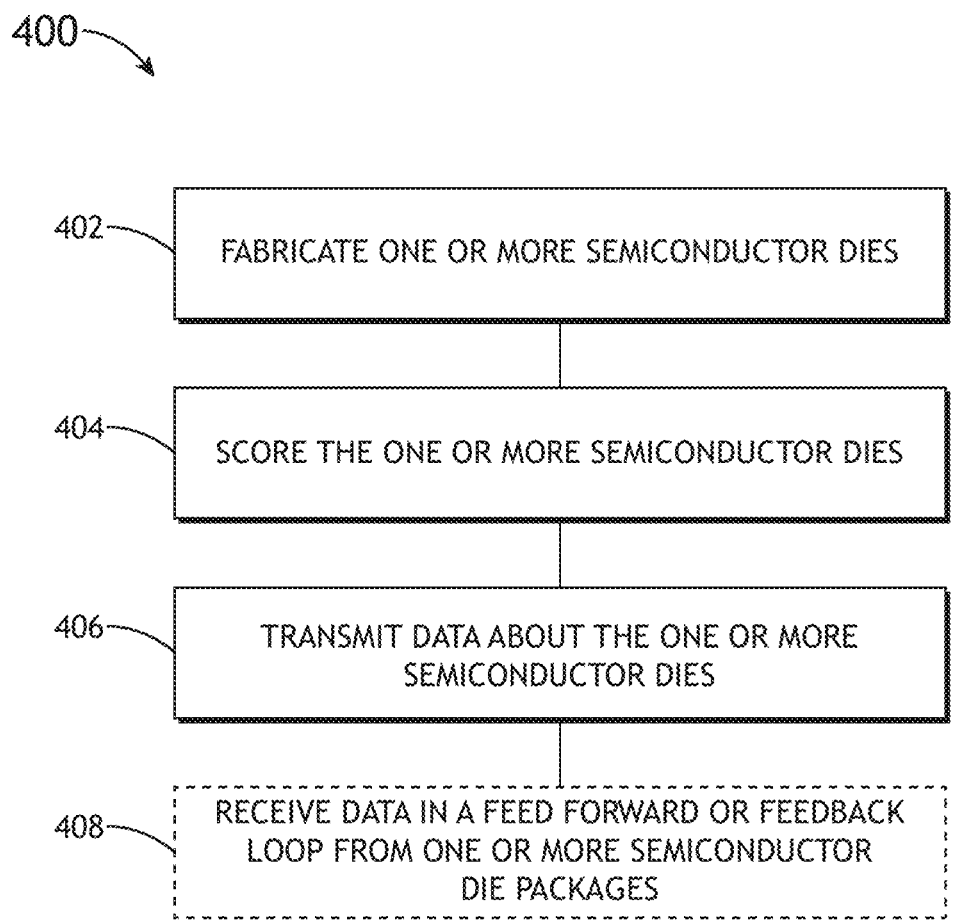
FIG. 4A is a flow diagram illustrating steps performed in a method for evaluating the reliability of semiconductor die packages, in accordance with one or more embodiments of the present disclosure.
Figure 4B:
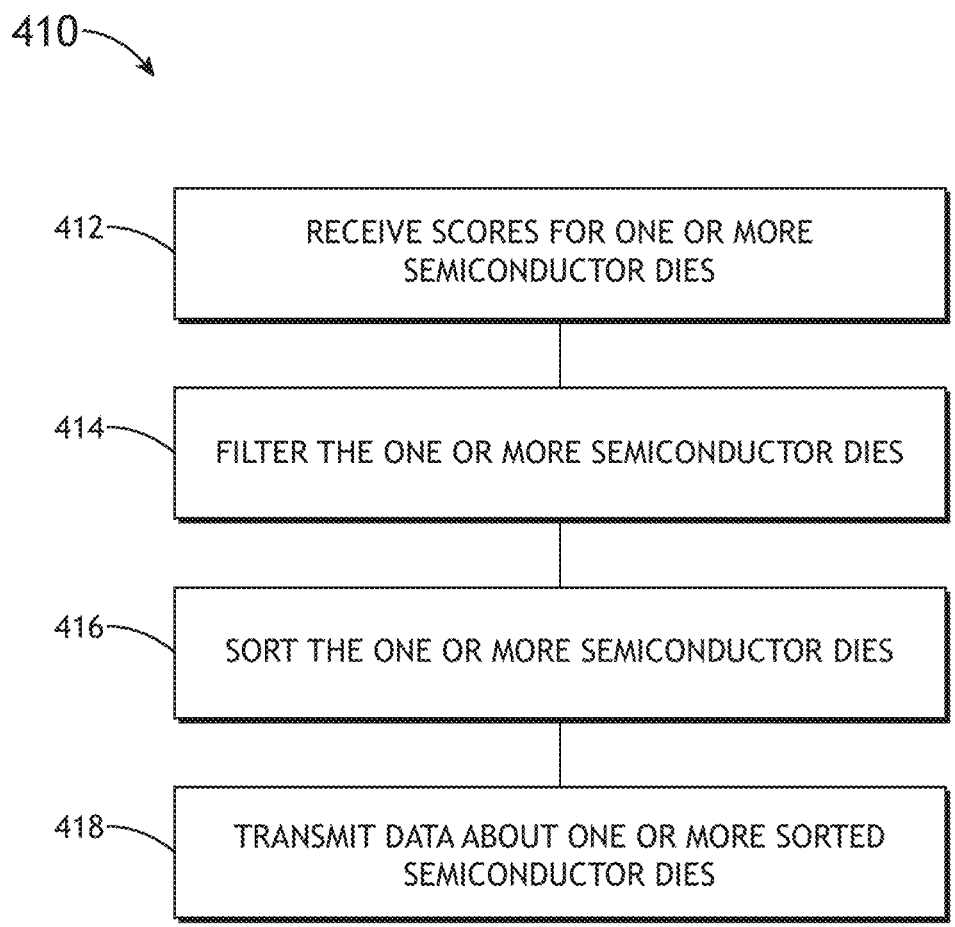
FIG. 4B is a flow diagram illustrating steps performed in a method for evaluating the reliability of semiconductor die packages, in accordance with one or more embodiments of the present disclosure.
Figure 4C:
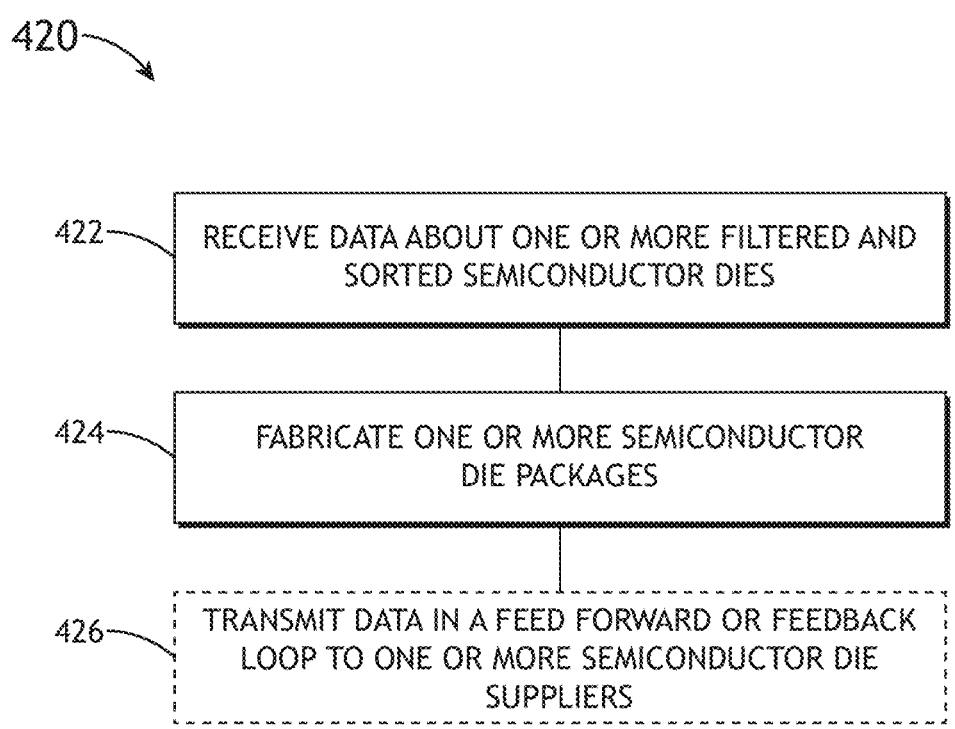
FIG. 4C is a flow diagram illustrating steps performed in a method for evaluating the reliability of semiconductor die packages, in accordance with one or more embodiments of the present disclosure.

FIG. 3 illustrates the system 100 for evaluating the reliability of semiconductor die packages, in accordance with one or more embodiments of the present disclosure. FIGS. 4A-4C illustrates methods or process for evaluating the reliability of semiconductor die packages, in accordance with one or more embodiments of the present disclosure. It is noted herein that the steps of method or processes in FIGS. 4A-4C may be implemented all or in part by the system 100 illustrated in FIGS. 1A-3. It is further recognized, however, that the methods or processes in FIGS. 4A-4C are not limited to the system 100 illustrated in FIGS. 1A-3 in that additional or alternative system-level embodiments may carry out all or part of the steps of methods or processes.

FIG. 4A illustrates a method or process 400 for fabricating semiconductor die, in accordance with one or more embodiments of the present disclosure.

It is noted herein any step of the method or process 400 may include any selected dies within any selected number of samples 202. For example, a population may include, but is not limited to, selected dies from a single sample 202, multiple samples 202 within a lot (e.g., a production lot), or selected samples 202 across multiple lots.

In a step 402, one or more semiconductor dies are fabricated. In one embodiment, one or more semiconductor die suppliers fabricate one or more semiconductor wafers 300 including the one or more semiconductor dies 302 with the one or more semiconductor die supplier subsystems 110, as described throughout the present disclosure.

In a step 404, the one or more semiconductor dies are scored. In one embodiment, the one or more semiconductor dies 302 are scored using in-line screening enabled by I-PAT weighted outlier detection. For example, I-PAT aggregates defectivity per die across multiple layers. Using multiple defect attributes gathered at run time, an I-PAT system may recognize and assign the defect to one of several weighted categories. Each semiconductor die may earn an aggregate score based on the summed value of the quantity of each weighted defect detected across the layers inspected. The semiconductor die with the very highest weighted scored that are outliers from the rest of the population are recommended for removal or close-disposition during electrical tests and/or stress tests. It is noted herein the score may be traceable to each particular semiconductor die 302 of the one or more semiconductor dies 302. Example uses of PAT methods including, but not limited to, I-PAT methods during semiconductor device fabrication may be found in U.S. Pat. No. 10,761,128, issued on Sep. 1, 2020, and U.S. patent application Ser. No. 17/101,856, filed on Nov. 23, 2020, which are each previously incorporated herein in the entirety.

It is noted herein the one or more semiconductor die suppliers may implement a threshold to prevent semiconductor dies 302 with killer defects or known LRD from entering the market, such as the very highest weighted scored being considered outliers from the rest of the population and being recommended for removal or close-disposition during electrical tests and/or stress tests. However, the threshold implemented by the one or more semiconductor die suppliers may be less strict than a threshold implemented by one or more semiconductor die packagers. As such, additional thresholds may need to be in place, including thresholds based on scores generated using in-line screening enabled by I-PAT weighted outlier detection.

In a step 406, data about the one or more semiconductor dies is transmitted. In one embodiment, the scores for the one or more semiconductor dies are transmitted. It is noted herein the scores may be combined with electrical test data and/or stress test data for the one or more semiconductor dies 302. In addition, the scores may be combined with other supporting information such as embedded electronic chip identification (ECID) or other unique physical or electrical identifiers of the one or more semiconductor dies 302 that persist after singulation, testing, and/or die sorting. Further, the scores may be paired with other supporting information that adds context to each ranking such as, but not limited to, lot scores, range and mean, rolling averages, or the like for the one or more semiconductor dies 302 and/or for the one or more semiconductor wafers 300 from which the one or more semiconductor dies 302 originate.

In a step 408, data is received in a feed forward or feedback loop from one or more semiconductor die packagers. In one embodiment, the data is used to improve semiconductor die fabrication systems and processes or methods.

FIG. 4B illustrates a method or process 410 for fabricating semiconductor die, in accordance with one or more embodiments of the present disclosure. It is noted herein the method or process 410 may be performed immediately following the method or process 400, at a select amount of time after the method or process 400, or independently of the method or process 400.

In a step 412, scores for one or more semiconductor dies are received. In one embodiment, semiconductor die data 112 including the scores for the one or more semiconductor dies 302 and other supporting information is transmitted from the one or more semiconductor die suppliers (e.g., via the one or more semiconductor die supplier subsystems 110 and/or the one or more auxiliary controllers or servers 118) to the controller or server 102, as described throughout the present disclosure. In another embodiment, a Known Good Die (KGD) subsystem 306 is configured to operate on the controller or server 102. In another embodiment, the KGD subsystem 306 is configured to maintain a KGD database 308, into which the data including the scores for the one or more semiconductor dies 302 and other supporting information may be entered.

It is noted herein the KGD subsystem 306 and/or the KGD database 308 may be maintained and/or configured to operate on a physical server (e.g., either on-site or third-party) or on a web-based cloud storage. For example, the third-party physical server and/or the web-based cloud storage may be implemented as part of a subscription service.

In a step 414, the one or more semiconductor dies are filtered. In one embodiment, at-risk semiconductor dies 302 are filtered out as semiconductor die rejects 310. For example, at-risk semiconductor dies 302 with a high weighted defectivity score equal to or above a high-risk I-PAT score threshold 312 (e.g., which may cause an entire semiconductor die package 304 to fail) may be labelled as semiconductor die rejects 310 by the KGD subsystem 306 and removed from consideration for the semiconductor die packages 304. It is noted herein the at-risk semiconductor die 302 with the high weighted defectivity equal to or above the high-risk I-PAT score threshold 312 may be removed by the semiconductor die suppliers if determined during fabrication of the semiconductor dies 302.

In a step 416, the one or more semiconductor dies are sorted. For example, the KGD subsystem 306 may take into consideration one or more I-PAT score thresholds based on the scores including the I-PAT outlier weighted metric when sorting the semiconductor dies 302 to be recommended for semiconductor die packages 304. By way of another example, the KGD subsystem 306 may be configured to compare the I-PAT scores of the one or more semiconductor dies 302 in conjunction with electrical test data, stress test data, and/or other supporting information to sort the one or more semiconductor dies 302.

In one embodiment, the one or more semiconductor dies 302 are sorted to determine which of the one or more semiconductor dies 302 should go into which semiconductor die packages 304. For example, more reliable semiconductor dies 302 with weighted defectivity scores below the high-risk I-PAT score threshold 312 may be considered for the semiconductor die packages 304, and additional I-PAT score thresholds may be applied to determine the quality of the remaining semiconductor dies 302 to pair or bin semiconductor die 302 based on suitability and probable reliability into semiconductor die stacks of similar attributes.

In one non-limiting example, semiconductor dies 302 with a low or the lowest weighted defectivity score equal to or below a low-risk I-PAT score threshold 314 may be labelled as premium or highest-quality semiconductor dies 304a. For example, the premium or highest-quality semiconductor dies 304a from one or more semiconductor die suppliers may be included in high-reliability semiconductor packages based on the determination by the KGD subsystem 306. For instance, at least twenty of the premium or highest-quality semiconductor dies 304a from one or more semiconductor die suppliers may be included in high-reliability semiconductor packages.

By way of another example, semiconductor dies 302 with a medium weighted defectivity score corresponding to a medium-risk I-PAT score threshold within a range of I-PAT scores 316 and between the I-PAT score thresholds 312, 314 may be labelled as passing or lower-quality semiconductor dies 304b, 304c, . . . 304N, where N represents any number of semiconductor die groups defined by a number of I-PAT score thresholds. For example, the passing or low-quality semiconductor dies 304b, 304c, . . . 304N from one or more semiconductor die suppliers may be included in lower- or lowest-reliability semiconductor packages based on the determination by the KGD subsystem 306. For instance, no more than five of the passing or lower-quality semiconductor dies 304b, 304c, . . . 304N from one or more semiconductor die suppliers may be included in lower- or lowest-reliability semiconductor packages.

It is noted herein the KGD subsystem 306 may take into account more thresholds than the I-PAT score thresholds 312, 314, further defining medium-risk I-PAT score thresholds within the range of I-PAT scores 316. Accordingly, it is to be understood that examples of I-PAT score thresholds in the present disclosure are provided solely for illustrative purposes and should not be interpreted as limiting.

In general, semiconductor dies with similar reliability risk profiles (e.g., including similar I-PAT scores, electrical test data, stress test data, physical or electrical identifiers including embedded ECID, or the like) may be sorted to serve market segments. For example, the market segments may require different levels of reliability (e.g., parts-per-million (PPM), part-per-billion (PPB), or the like). By way of another example, the market segments may have different price requirements. This increased market segmentation may allow for predicted die reliability to serve varied price and performance requirements of a broad market for stacked semiconductor die packages. For example, die with a high I-PAT score that pass electrical tests and/or stress tests should be rejected from any semiconductor die stack, as they are a likely source of failure for the entire semiconductor die package, improving yield and saving money. By way of another example, semiconductor die with a very low I-PAT score and good electrical test and/or stress test results may be considered premium "known good die" destined for the most critical applications. By way of another example, die with a passing but elevated I-PAT score may still be useful in cheaper market segments with lower reliability requirements.

It is noted herein the KGD subsystem 306 is suitable for all semiconductor die assessment used in any stacking methodology and is believed to hold particular value for bare semiconductor die in advanced devices for which the ability for thorough electrical testing is currently lacking.

In this regard, the KGD subsystem 306 may generate additional thresholds for the semiconductor die packagers. Adding I-PAT information improves the ability of the supply chain to adjudicate "known good die" and to create a more predictable die stack reliability while serving the unique needs of multiple segments. By utilizing scores generated with I-PAT weighted defectivity outlier screening, the KGD subsystem 306 provides an independent and highly-correlated detection of semiconductor dies 302 likely to fail electrical tests and/or stress tests. In addition, the KGD subsystem 306 may provide an additional benefit of recognizing potential die defectivity driven failure mechanisms present in test coverage gaps, statistical test escapes, untested fault modes, untestable die regions and/or unactivated latent failures that go unseen in current electrical test- and/or stress test- centric methods. Further, any overlap of I-PAT data with existing electrical test data and/or stress test data acts as an independent confirmation of the suitability of the semiconductor die, while also bringing additional valuable data to determine the appropriate semiconductor die disposition.

In another embodiment, the KGD subsystem 306 may compare and trend I-PAT scores against final package yield over time for semiconductor die from the one or more semiconductor die suppliers to assist semiconductor die packagers with quality enhancement and semiconductor die supplier management.

In a step 418, data about one or more filtered and sorted semiconductor dies is transmitted. In one embodiment, the semiconductor die reliability data 116 is transmitted to the semiconductor die packagers (e.g., via the semiconductor die packager subsystems 114).

FIG. 4C illustrates a method or process 420 for fabricating semiconductor die packages, in accordance with one or more embodiments of the present disclosure. It is noted herein the method or process 420 may be performed immediately following the method or process 410, at a select amount of time after the method or process 410, or independently of the method or process 410.

In a step 422, data about one or more filtered and sorted semiconductor dies is received. In one embodiment, data about one or more filtered and sorted semiconductor dies 302 as determined by the KGD subsystem 306 is transmitted from the controller or server 102 to the one or more semiconductor die packagers (e.g., via the one or more semiconductor die packager subsystems 114 and/or the one or more auxiliary controllers or servers 120).

In a step 424, one or more semiconductor die packages 304 are fabricated. In one embodiment, one or more semiconductor die packagers obtain the one or more filtered and sorted semiconductor dies 302. For example, the one or more semiconductor die packagers may hand-select the one or more filtered and sorted semiconductor dies 302 prior to delivery. By way of another example, the one or more semiconductor die packagers may buy in semiconductor dies 302 in bulk, and then separate out the one or more filtered and sorted semiconductor dies 302.

In another embodiment, the one or more semiconductor die packagers generate one or more semiconductor die packages 304 including the one or more filtered and sorted semiconductor dies 302 with the one or more semiconductor die packager subsystems 114, as described throughout the present disclosure. For example, the sorted and filtered semiconductor dies 302 may be obtained and utilized in the manufacture of the one or more semiconductor die packages 304 in a 2.5D and/or 3D arrangement.

In a step 426, data is transmitted in a feed forward or feedback loop to one or more semiconductor die suppliers. In one embodiment, the data is used to improve semiconductor die fabrication systems and processes or methods based on at least the semiconductor die reliability data generated by the KGD subsystem 306.

It is noted herein one illustrative example involves a semiconductor die packager in the automotive, military, aeronautical, and/or medical industries receiving bare die components for a 3D semiconductor die stack from three separate semiconductor die suppliers, where each bare die component with is delivered by the three separate semiconductor die suppliers with uncertain reliability caused by lack of information (e.g., memory and logic) preventing testing during a semiconductor wafer probe.

Without the KGD subsystem 306, the semiconductor die packager in the automotive, military, aeronautical, and/or medical industries operating with failure rates in the parts-per-billion (PPB) range may be required to integrate the components into a 3D semiconductor die package based on limited bare die testing data and random pairing or binning of components. A multiplicative effect of the yield rates of the components, combined with untestable failures and other test gaps, create expensive and unpredictable yield loss at packaging with no clear ownership or path for improvement.

With the KGD subsystem 306, however, the semiconductor die packager in the automotive, military, aeronautical, and/or medical industries operating with failure rates in the parts-per-billion (PPB) range may utilize the I-PAT scores from each incoming semiconductor die supplier to reject any outlier components outright to reduce the yield loss costs of the other die components and the costs of integration. In addition, the semiconductor die packager may pair or bin semiconductor die of similar I-PAT scores into stacks with the highest probability for reliability for use in the most mission and safety critical roles, while re-using the other components in less critical applications. Further, the I-PAT scores may be used as a quality metric from managing the supply chain and driving continuous improvement.

It is noted herein the system 100 and its subsystems 110, 114, 306 and the corresponding methods or processes 400, 410, 420 may be operated by separate semiconductor die suppliers (e.g., in possession of the one or more semiconductor die supplier subsystems 110), semiconductor die packagers (e.g., in possession of the one or more semiconductor die packager subsystems 114), third-party operators of the controller or server 102, and/or third-party operators of the one or more auxiliary controllers or servers 118, 120.

In addition, it is noted herein the one or more semiconductor die supplier subsystems 110, the one or more semiconductor die packager subsystems 114, the controller or server 102, and/or the one or more auxiliary controllers or servers 118, 120 may be commonly possessed. In one non-limiting example, the semiconductor die packagers may be in possession of the one or more semiconductor die packager subsystems 114 and the controller or server 102, making the KGD subsystem 306 a local subsystem that may receive data from multiple semiconductor die suppliers (e.g., via the one or more semiconductor die supplier subsystems 110).

In another non-limiting example, the semiconductor die suppliers may be in possession of the one or more semiconductor die supplier subsystems 110 and the one or more auxiliary controllers or servers 118. In another non-limiting example, the semiconductor die packagers may be in possession of the one or more semiconductor die packager subsystems 114 and the one or more auxiliary controllers or servers 120.

Accordingly, it is to be understood that examples of subsystem, or controller or server, possession described throughout the present disclosure are provided solely for illustrative purposes and should not be interpreted as limiting.

The semiconductor die data 112 and/or the semiconductor die reliability data 116 may be in a non-standardized format, such that the one or more semiconductor die supplier subsystems 110 and/or the one or more semiconductor die packager subsystems 114 may be configured to operate using data in a non-standardized data format. For example, the semiconductor die data 112 and/or the semiconductor die reliability data 116 may be formatted for use with different operating systems including, but not limited to, Android, Apple iOS, Microsoft Windows, Apple macOS, Linux, ChromeOS, Unix, Ubuntu, a proprietary operating system requiring proprietary or non-proprietary data formats, or the like.

The controller or server 102 may be configured to operate using data in a standardized data format to evaluating the reliability of semiconductor die packages. For example, the data may be formatted for use with a single operating system (or complementary operating systems) from the non-limiting list above. The system 100 may be configured to convert the semiconductor die data 112 and/or the semiconductor die reliability data 116 from multiple non-standardized data formats to data in the standardized data format for the controller or server 102.

In one non-limiting example, the one or more semiconductor die supplier subsystems 110 may generate the semiconductor die data 112 in a non-standardized data format and during or following the method or process 400.

For instance, the one or more semiconductor die supplier subsystems 110 may convert the semiconductor die data 112 into a standardized data format prior to transmission to the controller or server 102.

In addition, the one or more semiconductor die supplier subsystems 110 may transmit the semiconductor die data 112 in the non-standardized data format to the controller or server 102, and the controller or server 102 may convert the semiconductor die data 112 into a standardized data format following receipt and prior to use in the method or process 410.

In another non-limiting example, the one or more semiconductor die packager subsystems 114 may use the semiconductor die reliability data 116 in a non-standardized data format.

For instance, the one or more semiconductor die packager subsystems 114 may receive the semiconductor die reliability data 116 in a standardized data format, and convert the semiconductor die reliability data 116 into a non-standardized data format following receipt and prior to use in the method or process 420.

In addition, the controller or server 102 may convert the semiconductor die reliability data 116 into a non-standardized data format during or following the method or process 410 and prior to transmission to the one or more semiconductor die packager subsystems 114, and the one or more semiconductor die packager subsystems 114 may receive the semiconductor die reliability data 116 in the non-standardized data format.

It is noted herein the distinctions of operating with "standardized data formats" and/or "non-standardized data formats" is not intended to be limiting. For example, the one or more semiconductor die supplier subsystems 110 and/or the one or more semiconductor die packager subsystems 114 may be configured to operate with standardized data. By way of another example, the controller or server 102 may be configured to operate with non-standardized data. By way of another example, the one or more semiconductor die supplier subsystems 110, the one or more semiconductor die packager subsystems 114, and the controller or server 102 may be configured to operate with standardized data. By way of another example, the one or more semiconductor die supplier subsystems 110, the one or more semiconductor die packager subsystems 114, and the controller or server 102 may be configured to operate with non-standardized data. Accordingly, it is to be understood that examples of data formats in the present disclosure are provided solely for illustrative purposes and should not be interpreted as limiting.

It is noted herein the methods or processes 400, 410, 420 are not limited to the steps and/or sub-steps provided. The methods or processes 400, 410, 420 may include more or fewer steps and/or sub-steps. The methods or processes 400, 410, 420 may perform the steps and/or sub-steps simultaneously. The methods or processes 400, 410, 420 may perform the steps and/or sub-steps sequentially, including in the order provided or an order other than provided. Therefore, the above description should not be interpreted as a limitation on the scope of the present disclosure but merely an illustration.

In this regard, advantages of the present disclosure include semiconductor die packagers reducing yield loss (and thus reduce costs, fabrication downtime, or the like) by relying on a determination of Known Good Dies (KGD) for use in the semiconductor die package. Advantages of the present disclosure also include implementing I-PAT methods to generate defectivity scores or rankings (e.g., weighted or unweighted) for one or multiple semiconductor dies across one or multiple semiconductor vendors. Advantages of the present disclosure also include pairing semiconductor dies or semiconductor die sub-packages with similar reliability risk profiles. Advantages of the present disclosure also include segmenting semiconductor die packages into different performance and/or price or value categories.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed is:

1. A system comprising:
a controller, wherein the controller includes one or more processors and memory, wherein the memory is configured to store a set of program instructions, wherein the one or more processors are configured to execute program instructions causing the one or more processors to:
receive semiconductor die data about a plurality of semiconductor dies from a plurality of semiconductor die supplier subsystems, wherein the semiconductor die data includes an inline part average testing (I-PAT) score for each of the plurality of semiconductor dies, wherein the I-PAT score represents a weighted defectivity of the corresponding semiconductor die;
filter a high-risk subset of the plurality of semiconductor dies with a Known Good Die (KGD) subsystem, wherein the high-risk subset of the plurality of semiconductor dies includes one or more semiconductor die rejects with corresponding I-PAT scores equal to or above a high-risk I-PAT score threshold of the plurality of I-PAT score thresholds;
sort the plurality of semiconductor dies with the KGD subsystem based on a comparison of the I-PAT score of each of the plurality of semiconductor dies to the plurality of I-PAT score thresholds; and
transmit semiconductor die reliability data about the sorted plurality of semiconductor dies to a plurality of semiconductor die packager subsystems.

2. The system of claim 1, wherein the subset of semiconductor dies including the one or more semiconductor die rejects with corresponding I-PAT scores equal to or above the high-risk I-PAT score threshold is rejected based on semiconductor die data received from at least two of the plurality of semiconductor die supplier subsystems.

3. The system of claim 1, wherein the plurality of I-PAT score thresholds includes a low-risk I-PAT score threshold below the high-risk I-PAT score threshold,
wherein the one or more processors are configured to execute program instructions causing the one or more processors to sort a low-risk subset of the plurality of semiconductor dies, wherein the low-risk subset of the plurality of semiconductor dies includes semiconductor dies with corresponding I-PAT scores equal to or below the low-risk I-PAT score threshold.

4. The system of claim 3, wherein the low-risk subset of semiconductor dies including semiconductor dies with corresponding I-PAT scores equal to or below the low-risk I-PAT score threshold is sorted based on semiconductor die data received from at least two of the plurality of semiconductor die supplier subsystems.

5. The system of claim 3, wherein the low-risk subset of semiconductor dies including semiconductor dies with corresponding I-PAT scores equal to or below the low-risk I-PAT score threshold is usable in one or more semiconductor die packages manufactured for market segments in at least one of an automotive, military, aeronautical, or medical industry operating with failure rates in the parts-per-billion (PPB) range.

6. The system of claim 3, wherein the plurality of I-PAT score thresholds includes at least one medium-risk I-PAT score threshold between the high-risk I-PAT score threshold and the low-risk I-PAT score threshold.

7. The system of claim 6, wherein the sorting the plurality of semiconductor dies based on the at least one medium-risk I-PAT score threshold includes binning a subset of the plurality of semiconductor dies based on reliability risk profiles, wherein the reliability risk profiles of the subset of the plurality of semiconductor dies include I-PAT scores corresponding to the at least one medium-risk I-PAT score threshold.

8. The system of claim 7, wherein the reliability risk profiles of the subset of the plurality of semiconductor dies further include at least one of electrical test data, stress test data, or physical or electrical identifiers including embedded electronic chip identification (ECID) for the corresponding semiconductor die in the subset of the plurality of semiconductor dies.

9. The system of claim 6, wherein the medium-risk subset of semiconductor dies including semiconductor dies with I-PAT scores corresponding to the at least one medium-risk I-PAT score threshold is sorted based on semiconductor die data received from at least two of the plurality of semiconductor die supplier subsystems.

10. The system of claim 6, wherein the sorted medium-risk subset of semiconductor dies including semiconductor dies with I-PAT scores corresponding to the at least one medium-risk I-PAT score threshold is transmitted as semiconductor die reliability data to at least two of the plurality of semiconductor die packagers.

11. The system of claim 10, wherein a first binned portion of the medium-risk subset of semiconductor dies including semiconductor dies is usable in one or more semiconductor die packages manufactured by a first semiconductor die packager of the plurality of semiconductor die packages for a first market segment with a first price requirement,
wherein a second binned portion of the medium-risk subset of semiconductor dies including semiconductor dies is usable in one or more semiconductor die packages manufactured by a second semiconductor die packager of the plurality of semiconductor die packages for a second market segment with a second price requirement.

12. The system of claim 1, wherein at least some of the plurality of semiconductor die supplier subsystems uses one or more non-standardized data formats, wherein the controller uses a standardized data format,
wherein the one or more processors are further configured to execute program instructions causing the one or more processors to:
convert the semiconductor die data from the one or more non-standardized data formats to the standardized data format following receipt.

13. The system of claim 1, wherein at least some of the plurality of semiconductor die packager subsystems uses one or more non-standardized data formats, wherein the controller uses a standardized data format,
wherein the one or more processors are further configured to execute program instructions causing the one or more processors to:
convert the semiconductor die reliability data from the standardized data format to the one or more non-standardized data formats prior to transmission to the at least some of the plurality of semiconductor die packager subsystems.

14. A method comprising:
receiving, via a controller, semiconductor die data about a plurality of semiconductor dies from a plurality of semiconductor die supplier subsystems, wherein the semiconductor die data includes an inline part average testing (I-PAT) score for each of the plurality of semiconductor dies, wherein the I-PAT score represents a weighted defectivity of the corresponding semiconductor die;
filtering, via the controller, a high-risk subset of the plurality of semiconductor dies with a Known Good Die (KGD) subsystem, wherein the high-risk subset of the plurality of semiconductor dies includes one or more semiconductor die rejects with corresponding I-PAT scores equal to or above a high-risk I-PAT score threshold of the plurality of I-PAT score thresholds;
sorting, via the controller, the plurality of semiconductor dies with the KGD subsystem based on a comparison of the I-PAT score of each of the plurality of semiconductor dies to the plurality of I-PAT score thresholds; and
transmitting, via the controller, semiconductor die reliability data about the sorted plurality of semiconductor dies to a plurality of semiconductor die packager subsystems.

15. The method of claim 14, wherein the subset of semiconductor dies including the one or more semiconductor die rejects with corresponding I-PAT scores equal to or above the high-risk I-PAT score threshold is rejected based on semiconductor die data received from at least two of the plurality of semiconductor die supplier subsystems.

16. The method of claim 14, wherein the plurality of I-PAT score thresholds includes a low-risk I-PAT score threshold below the high-risk I-PAT score threshold,
wherein the method further comprises:
sorting, via the controller, a low-risk subset of the plurality of semiconductor dies, wherein the low-risk subset of the plurality of semiconductor die includes semiconductor dies with corresponding I-PAT scores equal to or below the low-risk I-PAT score threshold.

17. The method of claim 16, wherein the low-risk subset of semiconductor dies including semiconductor dies with corresponding I-PAT scores equal to or below the low-risk I-PAT score threshold is sorted based on semiconductor die data received from at least two of the plurality of semiconductor die supplier subsystems.

18. The method of claim 16, wherein the low-risk subset of semiconductor dies including semiconductor dies with corresponding I-PAT scores equal to or below the low-risk I-PAT score threshold is usable in one or more semiconductor die packages manufactured for market segments in the automotive or aerospace industry operating with failure rates in the parts-per-billion (PPB) range.

19. The method of claim 16, wherein the plurality of I-PAT score thresholds includes at least one medium-risk I-PAT score threshold between the high-risk I-PAT score threshold and the low-risk I-PAT score threshold.

20. The method of claim 19, wherein the sorting the plurality of semiconductor dies based on the at least one medium-risk I-PAT score threshold includes binning a subset of the plurality of semiconductor dies based on reliability risk profiles, wherein the reliability risk profiles of the subset of the plurality of semiconductor dies include I-PAT scores corresponding to the at least one medium-risk I-PAT score threshold.

21. The method of claim 20, wherein the reliability risk profiles of the subset of the plurality of semiconductor dies further include at least one of electrical test data, stress test data, or physical or electrical identifiers including embedded electronic chip identification (ECID) for the corresponding semiconductor die in the subset of the plurality of semiconductor dies.

22. The method of claim 19, wherein the medium-risk subset of semiconductor dies including semiconductor dies with I-PAT scores corresponding to the at least one medium-risk I-PAT score threshold is sorted based on semiconductor die data received from at least two of the plurality of semiconductor die supplier subsystems.

23. The method of claim 19, wherein the sorted medium-risk subset of semiconductor dies including semiconductor dies with I-PAT scores corresponding to the at least one medium-risk I-PAT score threshold is transmitted as semiconductor die reliability data to at least two of the plurality of semiconductor die packagers.

24. The method of claim 23, wherein a first binned portion of the medium-risk subset of semiconductor dies including semiconductor dies is usable in one or more semiconductor die packages manufactured by a first semiconductor die packager of the plurality of semiconductor die packages for a first market segment with a first price requirement,
wherein a second binned portion of the medium-risk subset of semiconductor dies including semiconductor dies is usable in one or more semiconductor die packages manufactured by a second semiconductor die packager of the plurality of semiconductor die packages for a second market segment with a second price requirement.

25. The method of claim 14, wherein at least some of the plurality of semiconductor die supplier subsystems uses one or more non-standardized data formats, wherein the controller uses a standardized data format.

26. The method of claim 25, further comprising:
converting, via the controller, the semiconductor die data from the one or more non-standardized data formats to the standardized data format following receipt.

27. The method of claim 25, wherein the at least some of the plurality of semiconductor die supplier subsystems are configured to convert the semiconductor die data from the one or more non-standardized data formats to the standardized data format prior to receipt by the controller.

28. The method of claim 14, wherein at least some of the plurality of semiconductor die packager subsystems uses one or more non-standardized data formats, wherein the controller uses a standardized data format.

29. The method of claim 28, further comprising:
converting, via the controller, the semiconductor die reliability data from the standardized data format to the one or more non-standardized data formats prior to transmission to the at least some of the plurality of semiconductor die packager subsystems.

30. The method of claim 28, wherein the at least some of the plurality of semiconductor die packager subsystems are configured to convert the semiconductor die reliability data from the standardized data format to the one or more non-standardized data formats following transmission by the controller.

31. The method of claim 14, wherein the plurality of semiconductor die packager subsystems are configured to transmit data in a feed forward or feedback loop to the plurality of semiconductor die supplier subsystems based on the semiconductor die reliability data.

32. A system comprising:
a plurality of semiconductor die supplier subsystems;
a plurality of semiconductor die packager subsystems; and
a controller, wherein the controller includes one or more processors and memory, wherein the memory is configured to store a set of program instructions, wherein the one or more processors are to execute program instructions causing the one or more processors to:
receive semiconductor die data about a plurality of semiconductor dies from the plurality of semiconductor die supplier subsystems, wherein the semiconductor die data includes an inline part average testing (I-PAT) score for each of the plurality of semiconductor dies, wherein the I-PAT score represents a weighted defectivity of the corresponding semiconductor die;
filter a high-risk subset of the plurality of semiconductor dies with a Known Good Die (KGD) subsystem, wherein the high-risk subset of the plurality of semiconductor dies includes one or more semiconductor die rejects with corresponding I-PAT scores equal to or above a high-risk I-PAT score threshold of the plurality of I-PAT score thresholds;
sort the plurality of semiconductor dies with the KGD subsystem based on a comparison of the I-PAT score of each of the plurality of semiconductor dies to the plurality of I-PAT score thresholds; and
transmit semiconductor die reliability data about the sorted plurality of semiconductor dies to the plurality of semiconductor die packager subsystems.

33. The system of claim 32, wherein at least some of the plurality of semiconductor die supplier subsystems uses one or more non-standardized data formats, wherein the controller uses a standardized data format,
wherein the at least some of the plurality of semiconductor die supplier subsystems are configured to convert the semiconductor die data from the one or more non-standardized data formats to the standardized data format prior to receipt by the controller.

34. The system of claim 32, wherein at least some of the plurality of semiconductor die packager subsystems uses one or more non-standardized data formats, wherein the controller uses a standardized data format,
wherein the at least some of the plurality of semiconductor die packager subsystems are configured to convert the semiconductor die reliability data from the standardized data format to the one or more non-standardized data formats following transmission by the controller.

35. The system of claim 32, wherein the plurality of semiconductor die packager subsystems are configured to transmit data in a feed forward or feedback loop to the plurality of semiconductor die supplier subsystems based on the semiconductor die reliability data.

* * * * *